(12) United States Patent
Wu et al.

(10) Patent No.: US 8,861,899 B2
(45) Date of Patent: Oct. 14, 2014

(54) OPTICAL FIBER CURRENT TRANSFORMER WITH OPTICAL FIBER TEMPERATURE ACQUISITION AND TEMPERATURE COMPENSATION

(75) Inventors: Shudong Wu, Beijing (CN); Wenbo Wang, Beijing (CN)

(73) Assignee: Beijing Qi-Red Electric Power Technology Co., Ltd., Beijing (CN)

( * ) Notice: Subject to any disclaimer, the term of this patent is extended or adjusted under 35 U.S.C. 154(b) by 1077 days.

(21) Appl. No.: 12/875,861

(22) Filed: Sep. 3, 2010

(65) Prior Publication Data
US 2011/0060544 A1 Mar. 10, 2011

(30) Foreign Application Priority Data
Sep. 4, 2009 (CN) .......................... 2009 1 0092183

(51) Int. Cl.
*G02B 6/00* (2006.01)
*G01K 11/00* (2006.01)
*G01R 15/24* (2006.01)
*G01R 19/32* (2006.01)

(52) U.S. Cl.
CPC .............. *G01R 15/247* (2013.01); *G01K 11/00* (2013.01); *G01R 19/32* (2013.01)
USPC ............................................. 385/12; 385/39

(58) Field of Classification Search
None
See application file for complete search history.

(56) References Cited

U.S. PATENT DOCUMENTS 5,157,461 A * 10/1992 Page .............................. 356/462

* cited by examiner

*Primary Examiner* — Uyen Chau N Le
*Assistant Examiner* — Chad Smith

(57) ABSTRACT

An optical fiber current transformer includes a broadband light source, a depolarizer, a beam splitter, a temperature acquisition unit, a current acquisition unit, a modulation waveform generating unit, a data processing unit and a calculating compensation unit. The broadband light source is connected with the beam splitter by the depolarizer. A first output of the beam splitter is connected with the calculating compensation unit by the temperature acquisition unit. A second output of the beam splitter is connected with the data processing unit by the current acquisition unit. The data processing unit is connected with the calculating compensation unit. The calculating compensation unit is connected with the current acquisition unit by the modulation waveform generating unit. The optical fiber current transformer uses the temperature-current compensation curve in the calculating compensation unit to synchronously process the temperature and current, thereby improving the accuracy of real-time current measurement.

20 Claims, 2 Drawing Sheets

OPTICAL FIBER CURRENT TRANSFORMER WITH OPTICAL FIBER TEMPERATURE ACQUISITION AND TEMPERATURE COMPENSATION

BACKGROUND OF THE PRESENT INVENTION

1. Field of Invention

The present invention relates to an optical fiber current transformer, and more particularly to an optical fiber current transformer with two-temperature source compensation mode.

2. Description of Related Arts

The optical fiber current transformer is based on the Ampere's law and Faraday magneto-optical effect. It can indirectly measure the current value by measuring the phase difference, induced by the current magnetic field, between two orthogonally polarized light beams transmitting in the sensing fiber.

For optical fiber current transformers applied in the electrical power network, the environment temperature effects on the measured current value may include 1. The variation of magneto-optical coefficient with the change of temperature;
2. The retardation of fiber optic wave plate changes with the change of temperature;
3. The internal strain in the sensing fiber may vary with the change of temperature;
4. The half-wave voltage, $V\pi$, of phase modulators varies with the change of temperature;
5. The temperature effect of the analog circuit devices.

Therefore, the measurement of current performed by traditional optical fiber current transformers is low-accuracy due to the temperature effects of the sensor systems.

SUMMARY OF THE PRESENT INVENTION

An object of the present invention is to provide an optical fiber current transformer with fiber optical temperature acquisition and temperature compensation, which can improve the current measurement accuracy to be as high as 0.1%.

The present invention provides an optical fiber current transformer comprising a broadband light source, a depolarizer, a beam splitter, a temperature acquisition unit, a current acquisition unit, a modulation waveform generating unit, a data processing unit and a calculating compensation unit. Based on magneto-optical effect, the current acquisition unit outputs digital photoelectric signals, DOES, which contain the information of the current under test and delivers DOES to the data processing unit. From the DOES, the data processing unit derives the measured current $I_{in}$. In the temperature acquisition unit there is a temperature sensing element, which is based on a principle of birefringence-temperature effect of polarization maintenance fiber. The temperature acquisition unit acquires two digital temperatures $DT_1$ and $DT_2$ from the temperature sensing element and delivers $DT_1$ and $DT_2$ to the calculating compensation unit. In the calculating compensation unit, a compensation factor cf is pick-up from a pre-calibrated temperature-current compensation curve according to a temperature parameter TP, where $$TP = \frac{DT_1 - DT_2}{DT_1 + DT_2}.$$

Thus, a compensated measured output current $I_{out}=cf \times I_{in}$ can be obtained.

The optical fiber current transformer with fiber optic temperature acquisition and temperature compensation of the present invention has the following advantages.

(1) The present invention adopts the dual mode, with calculating compensation unit and data processing unit. The data processing for temperature and the current are carried out in different processors, and synchronized in the calculating compensation unit, thereby improving the accuracy of real-time current measurement of the optical fiber current transformer. The accuracy of the current measurement can be as high as 0.1%.

(2) Because sensed current signals and sensed temperature signals are transmitted through optical fibers, high-voltage insulation is not an issue. Therefore, the present invention is advantageous for power network with high-voltage and high-current.

(3) Modularization of the sensor system clearly distinguishes the function of each module. Accordingly, the faulting module can be easily detected while a fault occurs, thereby facilitating maintenance.

(4) The optical fiber current transformer of the present invention adopts two processors and hardware/software modularization, thereby facilitating the forming of single-phase optical fiber current transformers and tri-phase optical fiber current transformers.

(5) In a tri-phase optical fiber current transformer, the calculating compensation unit deals with the input data of three-phase temperature and three-phase current by a simple first-in-first-out mode, thereby improving the system response time to the output current.

These and other objects, features, and advantages of the present invention will become apparent from the following detailed description, the accompanying drawings, and the appended claims.

DETAILED DESCRIPTION OF THE PREFERRED EMBODIMENT

The present invention is further explained with the accompanying drawings.

Figure 1:
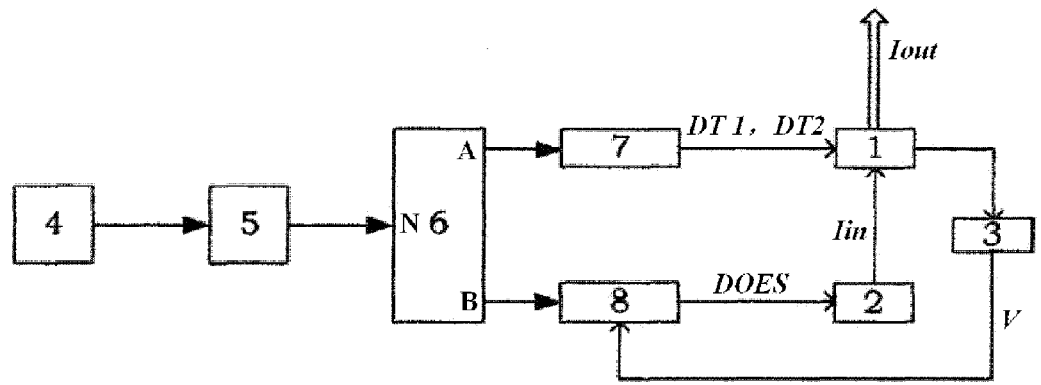
FIG. 1 is a block diagram of a single-phase optical fiber current transformer according to a preferred embodiment of the present invention.

Referring to FIG. 1, an optical fiber current transformer with optical fiber temperature acquisition and temperature compensation according to a preferred embodiment of the present invention is illustrated, wherein the optical fiber current transformer comprises a broadband light source 4, a depolarizer 5, a beam splitter 6, a temperature acquisition unit 7, a current acquisition unit 8, a modulation waveform generating unit 3, a data processing unit 2 and a calculating compensation unit 1. The calculating compensation unit 1 consists of an IC hardware and a two-temperature source compensation software module compiled in the IC hardware.

The IC hardware can be a DSP processor chip, a single chip microcomputer or a microprocessor. The data processing unit can be an FPGA processor.

The broadband light source 4 is connected with the input port N of the beam splitter 6 through the depolarizer 5.

The first output port A of the beam splitter 6 is connected with the calculating compensation unit 1 through the temperature acquisition unit 7.

The second output port B of the beam splitter 6 is connected with the data processing unit 2 through the current acquisition unit 8.

The data processing unit 2 is connected with the calculating compensation unit 1.

The calculating compensation unit 1 is connected with the current acquisition unit 8 through the modulation waveform generating unit 3.

The temperature acquisition unit 7 outputs a first digital temperature DT/and a second temperature $DT_2$ to the calculating compensation unit 1.

The current acquisition unit 8 outputs digitized photoelectric signals, DOES, to the data processing unit 2. By analyzing the DOES, the data processing unit 2 obtains the measured current, $I_{in}$, and then delivers $I_{in}$ to the calculating compensation unit 1.

In the temperature acquisition unit 7, there is a temperature sensing element, which is based on a principle of birefringence-temperature effect of polarization maintenance fiber. The temperature acquisition unit 7 acquires two digital temperatures $DT_1$ and $DT_2$ from the temperature sensing element and delivers $DT_1$ and $DT_2$ to the calculating compensation unit 1.

The calculating compensation unit 1 is used to perform temperature compensation for the optical fiber current transformer and also provides error feedback signals for closed-loops in the systems.

In the calculating compensation unit 1, the two digital temperatures $DT_1$ and $DT_2$ are converted into a temperature parameter TP, where $$TP = \frac{DT_1 - DT_2}{DT_1 + DT_2}.$$

According to the temperature parameter TP, a compensation factor cf can be pick-up from a pre-calibrated temperature-current compensation curve, cf vs. TP. Thus, a compensated measured output current can be obtained by $I_{out}=cf \times I_{in}$. Real-time current temperature compensation in the calculating compensation unit 1 greatly improves the accuracy of the measured output current of the optical fiber current transformer.

Figure 3:
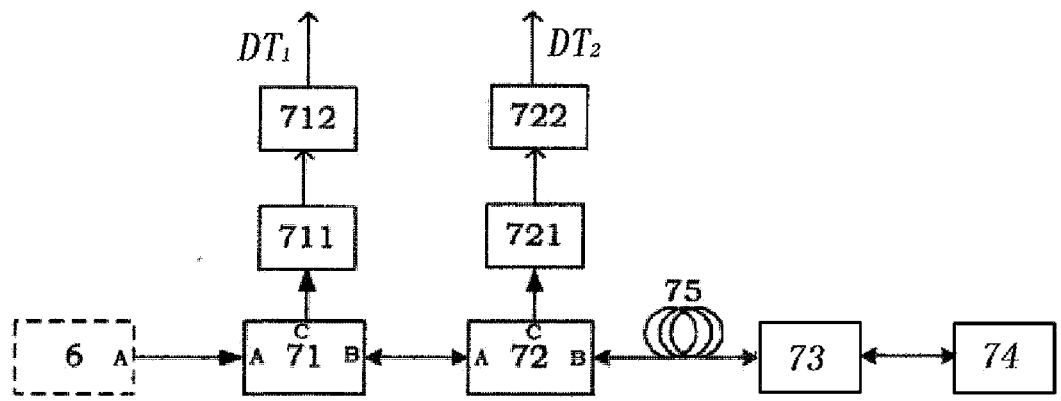
FIG. 3 is a block diagram of a temperature acquisition unit of the optical fiber current transformer.

Referring to FIG. 3, the temperature acquisition unit 7 consists of a first circulator 71, a polarization beam splitter 72, a first transmission fiber 75, a temperature sensing element 73 and a first fiber mirror 74, a first photoelectric detector 711, a second photoelectric detector 721, a first filter amplifier/analog to digital converter 712 and a second filter amplifier/analog to digital converter 722. The temperature sensing element 73 and the first fiber mirror 74 form a temperature sensing tip for sensing the environment temperature.

The connection relations among these elements in the temperature acquisition unit 7 are described as follow.

The input port A of the first circulator 71 is connected with the first output port A of the beam splitter 6. The forward output port B of the first circulator 71 is connected with the input port A of the polarization beam splitter 72, and the backward output port C of the first circulator 71 is connected with the first photoelectric detector 711.

The output voltage of the first photoelectric detector 711 is delivered to the first filter amplifier/analog to digital converter 712, the first filter amplifier/analog to digital converter 712 delivers the first digital temperature $DT_1$ to the calculating compensation unit 1.

The forward output port B of the polarization beam splitter 72 is connected with one end of the first transmission fiber 75. The backward output port C of the polarization beam splitter 72 is connected with the second photoelectric detector 721. The other end of the first transmission fiber 75 is connected with one end of the temperature sensing element 73, the other end of the temperature sensing element 73 is connected with the first fiber mirror 74.

The output voltage of the second photoelectric detector 721 is delivered to the second filter amplifier/analog to digital converter 722, the second filter amplifier/analog to digital converter 722 outputs the second digital temperature $DT_2$ to the calculating compensation unit 1.

In the temperature acquisition unit 7, the fiber optic temperature sensing tip consists of a temperature sensing element and followed by a fiber mirror. The temperature sensing element is a section of polarization maintaining fiber, whose length depends on the temperature range to be sensed.

Figure 4:
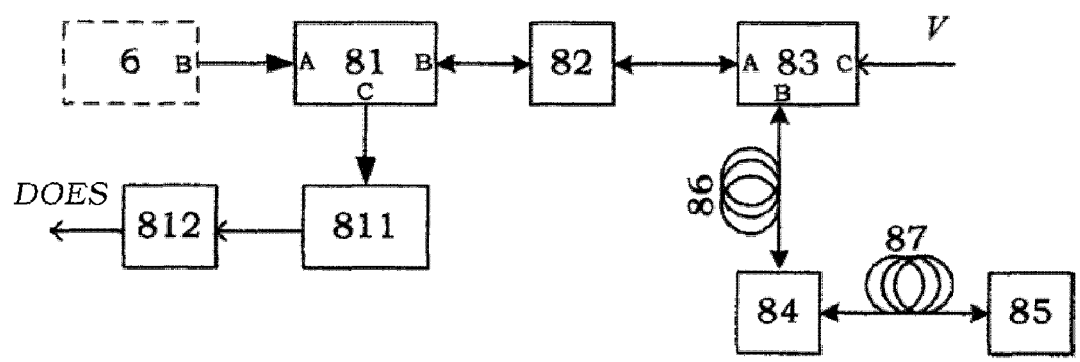
FIG. 4 is a block diagram of a current acquisition unit of the optical fiber current transformer.

Referring to FIG. 4, the current acquisition unit 8 consists of a second circulator 81, a polarizer 82, a phase modulator 83, a second transmission fiber 86, a quarter wave plate 84, a second fiber mirror 85, a sensing fiber 87, a third photoelectric detector 811, a third filter amplifier/analog to digital converter 812. The quarter wave plate 84, the second fiber mirror 85, the sensing fiber 87 are used to measure the current on power lines in high voltage power stations.

The connection relations among elements of the current acquisition unit 8 are described as follow.

The input port A of the second circulator 81 is connected with the second output port B of the beam splitter 6, the forward output port B of the second circulator 81 is connected with the input port A of the phase modulator 83 through the polarizer 82, and the backward output port C of the second circulator 81 is connected with the input port of the third photoelectric detector 811.

The output port B of the phase modulator 83 is connected with one end of the quarter wave plate 84 through the second transmission fiber 86. The other end of the quarter wave plate 84 is connected to the second fiber mirror 85 through the sensing fiber 87. Modulation voltage signal V from the modulation waveform generating unit 3 is fed to the RF input port C of the phase modulator 83.

The output port of the third photoelectric detector 811 is connected with the input port of the third filter amplifier/analog to digital converter 812. The filter amplifier/analog to digital converter 812 delivers the DOES to the data processing unit 2.

Figure 2:
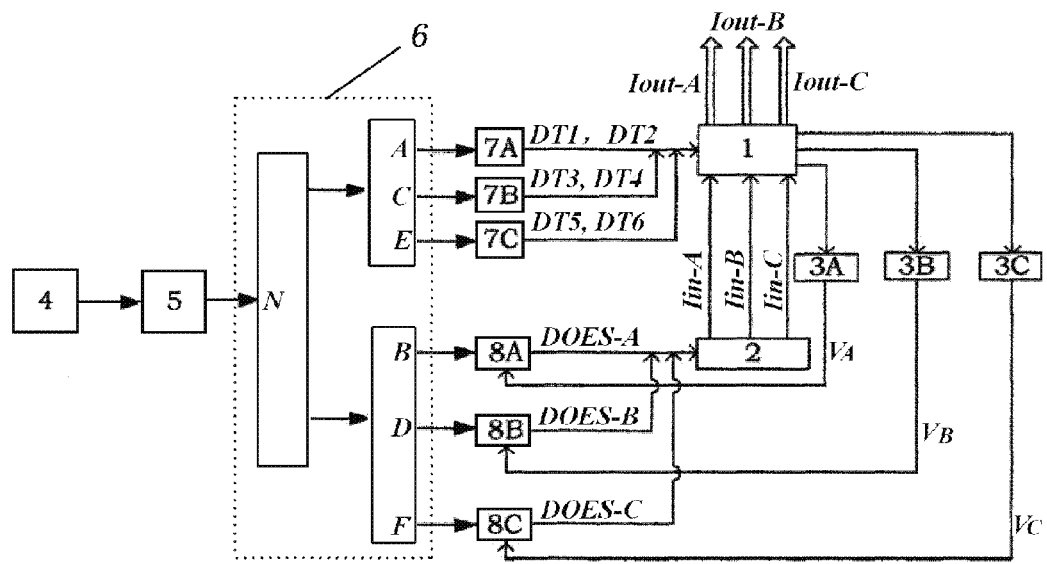
FIG. 2 is a block diagram of a tri-phase optical fiber current transformer according to a preferred embodiment of the present invention.

The present invention also provides a tri-phase layout design. FIG. 2 is a diagram of tri-phase optical fiber current transformer with temperature compensation.

As shown in FIG. 2, the tri-phase optical fiber current transformer comprises a broadband light source 4, a depolarizer 5, a beam splitter 6, a first temperature acquisition unit 7A, a second temperature acquisition unit 7B, a third temperature acquisition unit 7C, a first current acquisition unit 8A, a second current acquisition unit 8B, a third current acquisition unit 8C, a first modulation waveform generating unit 3A, a second modulation waveform generating unit 3B, a third modulation waveform generating unit 3C, a data processing unit 2 and a calculating compensation unit 1.

The beam splitter 6 comprises a 1×2 beam splitter, a first 1×3 beam splitter and a second 1×3 beam splitter.

The first temperature acquisition unit 7A, the second temperature acquisition unit 7B and the third temperature acquisition unit 7C have a same structure, the first current acquisition unit 8A, the second current acquisition unit 8B and the third current acquisition unit 8C have a same structure, and the first modulation waveform generating unit 3A, the second modulation waveform generating unit 3B and the third modulation waveform generating unit 3C have a same structure.

The connection relations among elements of the tri-phase optical fiber current transformer are described as follow.

The output port of the broadband light source 4 is connected with the input port of the depolarizer 5, the output port of the depolarizer 5 is connected with the input port of the 1×2 beam splitter.

The first output port of the 1×2 beam splitter is connected with the input port of the first 1×3 beam splitter, the second output port of the 1×2 beam splitter is connected with the input port of the second 1×3 beam splitter.

The first output port A of the first 1×3 beam splitter is connected with the input port of the first temperature acquisition unit 7A, the first temperature acquisition unit 7A outputs a first digital temperature $DT_1$ and a second digital temperature $DT_2$ to the calculating compensation unit 1, the first output port B of the second 1×3 beam splitter is fiber-connected with the input port of the first current acquisition unit 8A, the first current acquisition unit 8A outputs an A-phase digitized photoelectric signal DOES-A to the data processing unit 2, the A-phase digitized photoelectric signal DOES-A is transformed to be an A-phase detecting current $I_{in-A}$ by a current extraction of the data processing unit 2, then the data processing unit 2 outputs the A-phase detecting current $I_{in-A}$ to the calculating compensation unit 1, so that the calculating compensation unit 1 outputs the real-time output high-precision measuring current $I_{out-A}$.

The second output port C of the first 1×3 beam splitter is connected with the input port of the second temperature acquisition unit 7B, the second temperature acquisition unit 7B outputs a third digital temperature $DT_3$ and a fourth digital temperature $DT_4$ to the calculating compensation unit 1, the second output port D of the second 1×3 beam splitter is fiber-connected with the input port of the second current acquisition unit 8B, the second current acquisition unit 8B outputs a B-phase digitized photoelectric signal DOES-B to the data processing unit 2, the B-phase digitized photoelectric signal DOES-B is transformed to be a B-phase detecting current $I_{in-B}$ by a current extraction of the data processing unit 2, then the data processing unit 2 outputs the B-phase detecting current $I_{in-B}$ to the calculating compensation unit 1, so that the calculating compensation unit 1 outputs the real-time output high-precision measuring current $I_{out-B}$.

The third output port E of the first 1×3 beam splitter is connected with the input port of the third temperature acquisition unit 7C, the third temperature acquisition unit 7C outputs a fifth digital temperature $DT_5$ and a sixth digital temperature $DT_6$ to the calculating compensation unit 1, the third output port F of the second 1×3 beam splitter is fiber-connected with the input port of the third current acquisition unit 8C, the third current acquisition unit 8C outputs a C-phase digitized photoelectric signal DOES-C to the data processing unit 2, the C-phase digitized photoelectric signal DOES-C is transformed to be a C-phase detecting current $I_{in-C}$ by a current extraction of the data processing unit 2, then the data processing unit 2 outputs the C-phase detecting current $I_{in-C}$ to the calculating compensation unit 1, so that the calculating compensation unit 1 outputs the real-time output high-precision measuring current $I_{out-C}$.

The data processing unit 2 outputs the A-phase detecting current $I_{in-A}$, the B-phase detecting current $I_{in-B}$ and the C-phase detecting current $I_{in-C}$ to the calculating compensation unit 1 in accordance with a first-in-first-out order, if the data processing unit 2 outputs the A-phase detecting current $I_{in-A}$, the B-phase detecting current $I_{in-B}$ and the C-phase detecting current $I_{in-C}$ in turn, the calculating compensation unit 1 will firstly deal with the received first digital temperature $DT_1$ and the second digital temperature $DT_2$, secondly deal with the third digital temperature $DT_3$ and the fourth digital temperature $DT_4$, and lastly deal with the fifth digital temperature $DT_5$ and the sixth digital temperature $DT_6$.

According to an order given by the data processing unit 2, the calculating compensation unit 1 outputs three error correcting signals to the first modulation waveform generating unit 3A, the second modulation waveform generating unit 3B and the third modulation waveform generating unit 3C, respectively, the first modulation waveform generating unit 3A, the second modulation waveform generating unit 3B and the third modulation waveform generating unit 3C output a first modulation voltage signal $V_A$, a second modulation voltage signal $V_B$ and a third modulation voltage signal $V_C$ to the first current acquisition unit 8A, the second current acquisition unit 8B and the third current acquisition unit 8C respectively to modulate phase.

The calculating compensation unit 1 is used to perform temperature compensation for the tri-phase optical fiber current transformer.

The architecture of a tri-phase optical fiber current transformer is the same as that of a single-phase optical fiber current transformer. However, the tri-phase system is different from a simple combination of three single-phase systems. The differences are the follows:

1. Three single-phase systems share one broadband light source 4 and one depolarizer 5.
2. The beam splitter 6 comprises one 1×2 beam splitter and two 1×3 beam splitters. The 1×2 beam splitter divides the light into two paths, one for current acquisition and one for temperature acquisition. The two 1×3 beam splitters are used to deliver light to three current sensors and three temperature sensors, respectively.
3. Three single-phase systems share one data processing unit 2 and one calculation compensation unit 1. The shared data processing unit 2 receives DOES-A, DOES-B, and DOES-C from the current acquisition units 8A, 8B, and 8C, respectively. The shared data processing unit 2 also delivers the measured current $I_{in-A}$, $I_{in-B}$ and $I_{in-C}$ to the shared calculation compensation unit 1. The shared calculation compensation unit 1 outputs the measured output current, $I_{out-A}$, $I_{out-B}$ and $I_{out-C}$, respectively. The shared calculation compensation unit 1 also delivers three error correcting signals to the modulation waveform generating unit 3A, 3B, and 3C, respectively.
4. Besides great cost saving, the use of shared components would also facilitate data synchronization among three phases as well as with external clock.

One skilled in the art will understand that the embodiments of the present invention as shown in the drawings and described above are exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. An optical fiber current transformer with optical fiber temperature acquisition and temperature compensation, comprising:
a broadband light source, a depolarizer, a beam splitter, a temperature acquisition unit, a current acquisition unit, a modulation waveform generating unit, a data processing unit and a calculating compensation unit;
wherein an output port of said broadband light source is connected with an input port of said beam splitter by said depolarizer, a first output port of said beam splitter is connected with said calculating compensation unit by said temperature acquisition unit, a second output port of said beam splitter is connected with said data processing unit by said current acquisition unit, said data processing unit is connected with said calculating compensation unit, said calculating compensation unit is connected with said current acquisition unit by said modulation waveform generating unit;
wherein said temperature acquisition unit outputs a first digital temperature $DT_1$ and a second digital temperature $DT_2$ to said calculating compensation unit, said current acquisition unit outputs digitized photoelectronic signals, DOES, to said data processing unit, said data processing unit obtains a measured current $I_{in}$ by analyzing said DOES and then outputs said measured current $I_{in}$ to said calculating compensation unit, so that said calculating compensation unit outputs a real-time output high-precision measured current $I_{out}$;
wherein said calculating compensation unit outputs an error correcting signal to said modulation waveform generating unit, said modulation waveform generating unit produces a modulation voltage signal V in accordance with said error correcting signal, and then transmits said modulation voltage signal V to said current acquisition unit;
wherein said calculating compensation unit is used to perform temperature compensation for said optical fiber current transformer.

2. The optical fiber current transformer, as recited in claim 1, wherein said calculating compensation unit comprises an IC hardware and a two-temperature source compensation software module compiled in said IC hardware, wherein in said calculating compensation unit, said first digital temperature $DT_1$ and said second digital temperature $DT_2$ are converted into a temperature parameter TP, where $$TP = \frac{DT_1 - DT_2}{DT_1 + DT_2},$$

and then according to said temperature parameter TP, a compensation factor cf is pick-up from a pre-calibrated temperature-current compensation curve, cf vs. TP, so that said compensated measured output current $I_{out}$ is obtained by $I_{out} = cf \times I_{in}$.

3. The optical fiber current transformer, as recited in claim 2, wherein said temperature acquisition unit comprises a first circulator, a polarization beam splitter, a temperature sensing element, a first fiber mirror, a first transmission fiber, a first photoelectric detector, a second photoelectric detector, a first filter amplifier/analog to digital converter and a second filter amplifier/analog to digital converter,
wherein an input port of said first circulator is connected with said first output port of said beam splitter, a forward output port of said first circulator is connected with an input port of said polarization beam splitter, a backward output port of said first circulator is connected with an input port of said first photoelectric detector, an output port of said first photoelectric detector is connected with an input port of said first filter amplifier/analog to digital converter, said first filter amplifier/analog to digital converter outputs said first digital temperature $DT_1$ to said calculating compensation unit;
wherein one end of said first transmission fiber is connected with a forward output port of said polarization beam splitter, the other end of said first transmission fiber is connected with one end of said temperature sensing element, the other end of said temperature sensing element is connected with said first fiber mirror, a backward output port of said polarization beam splitter is connected with an input port of said second photoelectric detector, an output port of said second photoelectric detector is connected with an input port of said second filter amplifier/analog to digital converter, said second filter amplifier/analog to digital converter outputs said second digital temperature $DT_2$ to said calculating compensation unit.

4. The optical fiber current transformer, as recited in claim 3, wherein said temperature sensing element is a section of polarization maintaining fiber, a length of said temperature sensing element is determined by a temperature range to be measured.

5. The optical fiber current transformer, as recited in claim 1, wherein said current acquisition unit comprises a second circulator, a polarizer, a phase modulator, a second transmission fiber, a quarter wave plate, a sensing fiber, a second fiber mirror, a third photoelectric detector, and a third filter amplifier/analog to digital converter;
wherein an input port of said second circulator is connected with said second output port of said beam splitter, a forward output port of said second circulator is connected with an input port of said phase modulator through said polarizer, a backward output port of said second circulator is connected with said third photoelectric detector, an output port of said phase modulator is connected with one end of said second transmission fiber, the other end of said second transmission fiber is connected with one end of said quarter wave plate, the other end of said second quarter wave plate is connected with said second fiber mirror through said sensing fiber, an electric input port of said phase modulator receives said modulation voltage signal from said modulation waveform generating unit, an output voltage signal of said third photoelectric detector is delivered to an input port of said third filter amplifier/analog to digital converter, said third filter amplifier/analog to digital converter outputs said digital photoelectric signals, DOES, to said data processing unit.

6. The optical fiber current transformer, as recited in claim 2, wherein said current acquisition unit comprises a second circulator, a polarizer, a phase modulator, a second transmission fiber, a quarter wave plate, an sensing fiber, a second fiber mirror, a third photoelectric detector, a third filter amplifier/analog to digital converter;
wherein an input port of said second circulator is connected with said second output port of said beam splitter, a forward output port of said second circulator is connected with an input port of said phase modulator through said polarizer, a backward output port of said second circulator is connected with said third photoelectric detector, an output port of said phase modulator is connected with one end of said second transmission fiber, the other end of said second transmission fiber is connected with one end of said quarter wave plate, the other end of said second quarter wave plate is connected with said second fiber mirror through said sensing fiber, an electric input port of said phase modulator receives said modulation voltage signal from said modulation waveform generating unit, an output voltage signal of said third photoelectric detector is delivered to an input port of said third filter amplifier/analog to digital converter, said third filter amplifier/analog to digital converter outputs said digital photoelectric signals, DOES, to said data processing unit.

7. The optical fiber current transformer, as recited in claim 3, wherein said current acquisition unit comprises a second circulator, a polarizer, a phase modulator, a second transmission fiber, a quarter wave plate, an sensing fiber, a second fiber mirror, a third photoelectric detector, a third filter amplifier/analog to digital converter;

wherein an input port of said second circulator is connected with said second output port of said beam splitter, a forward output port of said second circulator is connected with an input port of said phase modulator through said polarizer, a backward output port of said second circulator is connected with said third photoelectric detector, an output port of said phase modulator is connected with one end of said second transmission fiber, the other end of said second transmission fiber is connected with one end of said quarter wave plate, the other end of said second quarter wave plate is connected with said second fiber mirror through said sensing fiber, an electric input port of said phase modulator receives said modulation voltage signal from said modulation waveform generating unit, an output voltage signal of said third photoelectric detector is delivered to an input port of said third filter amplifier/analog to digital converter, said third filter amplifier/analog to digital converter outputs said digital photoelectric signals, DOES, to said data processing unit.

8. The optical fiber current transformer, as recited in claim 4, wherein said current acquisition unit comprises a second circulator, a polarizer, a phase modulator, a second transmission fiber, a quarter wave plate, an sensing fiber, a second fiber mirror, a third photoelectric detector, a third filter amplifier/analog to digital converter;

wherein an input port of said second circulator is connected with said second output port of said beam splitter, a forward output port of said second circulator is connected with an input port of said phase modulator through said polarizer, a backward output port of said second circulator is connected with said third photoelectric detector, an output port of said phase modulator is connected with one end of said second transmission fiber, the other end of said second transmission fiber is connected with one end of said quarter wave plate, the other end of said second quarter wave plate is connected with said second fiber mirror through said sensing fiber, an electric input port of said phase modulator receives said modulation voltage signal from said modulation waveform generating unit, an output voltage signal of said third photoelectric detector is delivered to an input port of said third filter amplifier/analog to digital converter, said third filter amplifier/analog to digital converter outputs said digital photoelectric signals, DOES, to said data processing unit.

9. The optical fiber current transformer, as recited in claim 2, wherein said calculating compensation unit is a DSP processor chip.

10. The optical fiber current transformer, as recited in claim 2, wherein said data processing unit is an FPGA processor chip.

11. A tri-phase optical fiber current transformer with optical fiber temperature acquisition and temperature compensation comprising a broadband light source, a depolarizer, a beam splitter, a first temperature acquisition unit, a second temperature acquisition unit, a third temperature acquisition unit, a first current acquisition unit, a second current acquisition unit, a third current acquisition unit, a first modulation waveform generating unit, a second modulation waveform generating unit, a third modulation waveform generating unit, a data processing unit and a calculating compensation unit, wherein said beam splitter comprises a 1×2 beam splitter, a first 1×3 beam splitter and a second 1×3 beam splitter;

wherein said first temperature acquisition unit, said second temperature acquisition unit and said third temperature acquisition unit have a same structure, said first current acquisition unit, said second current acquisition unit and said third current acquisition unit have a same structure, and said first modulation waveform generating unit, said second modulation waveform generating unit and said third modulation waveform generating unit have a same structure;

wherein an output port of said broadband light source is connected with an input port of said depolarizer, an output port of said depolarizer is connected with an input port of said 1×2 beam splitter;

wherein a first output port of said 1×2 beam splitter is connected with an input port of said first 1×3 beam splitter, a second output port of said 1×2 beam splitter is connected with an input port of said second 1×3 beam splitter;

wherein a first output port of said first 1×3 beam splitter is connected with an input port of said first temperature acquisition unit, said first temperature acquisition unit outputs a first digital temperature $DT_1$ and a second digital temperature $DT_2$ to said calculating compensation unit, a first output port of said second 1×3 beam splitter is fiber-connected with said first current acquisition unit, said first current acquisition unit outputs an A-phase digitized photoelectric signal DOES-A to said data processing unit 2, said A-phase digitized photoelectric signal DOES-A is transformed to be an A-phase detecting current $I_{in-A}$ by said data processing unit, and then said data processing unit outputs said A-phase detected current $I_{in-A}$ to said calculating compensation unit, so that said calculating compensation unit outputs a real-time output high-precision measured current $I_{out-A}$;

wherein a second output port of said first 1×3 beam splitter is connected with an input port of said second temperature acquisition unit, said second temperature acquisition unit outputs a third digital temperature $DT_3$ and a fourth digital temperature $DT_4$ to said calculating compensation unit, a second output port of said second 1×3 beam splitter is fiber-connected with said second current acquisition unit, said second current acquisition unit outputs a B-phase digitized photoelectric signal DOES-B to said data processing unit, said B-phase digitized photoelectric signal DOES-B is transformed to be a B-phase detecting current $I_{in-B}$ by said data processing unit, and then said data processing unit outputs said B-phase detected current $I_{in-B}$ to said calculating compensation unit, so that said calculating compensation unit outputs a real-time output high-precision measured current $I_{out-B}$;

wherein a third output port of said first 1×3 beam splitter is connected with an input port of said third temperature acquisition unit, said third temperature acquisition unit outputs a fifth digital temperature $DT_5$ and a sixth digital temperature $DT_6$ to said calculating compensation unit, a third output port of said second 1×3 beam splitter is fiber-connected with said third current acquisition unit, said third current acquisition unit outputs a C-phase digitized photoelectric signal DOES-C to said data processing unit, said C-phase digitized photoelectric signal DOES-C is transformed to be a C-phase detected current $I_{in-C}$ by said data processing unit, and then said data processing unit outputs said C-phase detected current $I_{in-C}$ to said calculating compensation unit, so that said calculating compensation unit outputs a real-time output high-precision measured current $I_{out-C}$;

wherein said data processing unit outputs said A-phase detected current $I_{in-A}$, said B-phase detected current $I_{in-B}$ and said C-phase detected current $I_{in-C}$ to said calculating compensation unit in accordance with a first-in-first-out order, when said data processing unit outputs said A-phase detected current $I_{in-A}$, said B-phase detected current $I_{in-B}$ and said C-phase detected current $I_{in-C}$ in turn, said calculating compensation unit will firstly deal with said received first digital temperature $DT_1$ and said second digital temperature $DT_2$, secondly deal with said third digital temperature $DT_3$ and said fourth digital temperature $DT_4$, and lastly deal with said fifth digital temperature $DT_5$ and said sixth digital temperature $DT_6$;

wherein according to an order given by said data processing unit, said calculating compensation unit outputs three error correcting signals to said first modulation waveform generating unit, said second modulation waveform generating unit and said third modulation waveform generating unit, respectively, said first modulation waveform generating unit, said second modulation waveform generating unit and said third modulation waveform generating unit output a first modulation voltage signal $V_A$, a second modulation voltage signal $V_B$ and a third modulation voltage signal $V_C$ to said first current acquisition unit, said second current acquisition unit and said third current acquisition unit, respectively;

wherein said calculating compensation unit is used to perform temperature compensation for said optical fiber current transformer.

12. The tri-phase optical fiber current transformer, as recited in claim 11, wherein said calculating compensation unit comprises an IC hardware and a two-temperature source compensation software module compiled in said IC hardware.

13. The tri-phase optical fiber current transformer, as recited in claim 12, wherein said first temperature acquisition unit comprises a first circulator, a polarization beam splitter, a temperature sensing element, a first fiber mirror, a first transmission fiber, a first photoelectric detector, a second photoelectric detector, a first filter amplifier/analog to digital converter and a second filter amplifier/analog to digital converter, wherein a forward output port of said first circulator is connected with an input port of said polarization beam splitter, a backward output port of said first circulator is connected with an input port of said first photoelectric detector, an output port of said first photoelectric detector is connected with an input port of said first filter amplifier/analog to digital converter, said first filter amplifier/analog to digital converter outputs said first digital temperature $DT_1$ to said calculating compensation unit;

wherein one end of said first transmission fiber is connected with a forward output port of said polarization beam splitter, the other end of said first transmission fiber is connected with one end of said temperature sensing element, the other end of said temperature sensing element is connected with said first fiber mirror, a backward output port of said polarization beam splitter is connected with an input port of said second photoelectric detector, an output port of said second photoelectric detector is connected with an input port of said second filter amplifier/analog to digital converter, said second filter amplifier/analog to digital converter outputs said second digital temperature $DT_2$ to said calculating compensation unit.

14. The tri-phase optical fiber current transformer, as recited in claim 13, wherein said temperature sensing element is a section of polarization maintaining fiber, a length of said temperature sensing element is determined by a temperature range to be measured.

15. The tri-phase optical fiber current transformer, as recited in claim 11, wherein said first current acquisition unit comprises a second circulator, a polarizer, a phase modulator, a second transmission fiber, a quarter wave plate, a sensing fiber, a second fiber mirror, a third photoelectric detector, a third filter amplifier/analog to digital converter;

wherein a forward output port of said second circulator is connected with an input port of said phase modulator through said polarizer, a backward output port of said second circulator is connected with an input port of said third photoelectric detector, an output port of said phase modulator is connected with one end of said second transmission fiber, the other end of said second transmission fiber is connected with one end of said quarter wave plate, the other end of said second quarter wave plate is connected with said second fiber mirror through said sensing fiber, an electric input port of said phase modulator receives said modulation voltage signal from said modulation waveform generating unit, an output voltage signal of said third photoelectric detector is delivered to said third filter amplifier/analog to digital converter, said third filter amplifier/analog to digital converter outputs digital photoelectric signals, DOES, to said data processing unit.

16. The tri-phase optical fiber current transformer, as recited in claim 12, wherein said first current acquisition unit comprises a second circulator, a polarizer, a phase modulator, a second transmission fiber, a quarter wave plate, an sensing fiber, a second fiber mirror, a third photoelectric detector, a third filter amplifier/analog to digital converter;

wherein a forward output port of said second circulator is connected with an input port of said phase modulator through said polarizer, a backward output port of said second circulator is connected with an input port of said third photoelectric detector, an output port of said phase modulator is connected with one end of said second transmission fiber, the other end of said second transmission fiber is connected with one end of said quarter wave plate, the other end of said second quarter wave plate is connected with said second fiber mirror through said sensing fiber, an electric input port of said phase modulator receives said modulation voltage signal from said modulation waveform generating unit, an output voltage signal of said third photoelectric detector is delivered to said third filter amplifier/analog to digital converter, said third filter amplifier/analog to digital converter outputs digital photoelectric signals, DOES, to said data processing unit.

17. The tri-phase optical fiber current transformer, as recited in claim 13, wherein said first current acquisition unit comprises a second circulator, a polarizer, a phase modulator, a second transmission fiber, a quarter wave plate, an sensing fiber, a second fiber mirror, a third photoelectric detector, a third filter amplifier/analog to digital converter;

wherein a forward output port of said second circulator is connected with an input port of said phase modulator through said polarizer, a backward output port of said second circulator is connected with an input port of said third photoelectric detector, an output port of said phase modulator is connected with one end of said second transmission fiber, the other end of said second transmission fiber is connected with one end of said quarter wave plate, the other end of said second quarter wave plate is connected with said second fiber mirror through said sensing fiber, an electric input port of said phase modulator receives said modulation voltage signal from said modulation waveform generating unit, an output voltage signal of said third photoelectric detector is delivered to said third filter amplifier/analog to digital converter, said third filter amplifier/analog to digital converter outputs digital photoelectric signals, DOES, to said data processing unit.

18. The tri-phase optical fiber current transformer, as recited in claim 14, wherein said first current acquisition unit comprises a second circulator, a polarizer, a phase modulator, a second transmission fiber, a quarter wave plate, an sensing fiber, a second fiber mirror, a third photoelectric detector, a third filter amplifier/analog to digital converter;

wherein a forward output port of said second circulator is connected with an input port of said phase modulator through said polarizer, a backward output port of said second circulator is connected with an input port of said third photoelectric detector, an output port of said phase modulator is connected with one end of said second transmission fiber, the other end of said second transmission fiber is connected with one end of said quarter wave plate, the other end of said second quarter wave plate is connected with said second fiber mirror through said sensing fiber, an electric input port of said phase modulator receives said modulation voltage signal from said modulation waveform generating unit, an output voltage signal of said third photoelectric detector is delivered to said third filter amplifier/analog to digital converter, said third filter amplifier/analog to digital converter outputs digital photoelectric signals, DOES, to said data processing unit.

19. The tri-phase optical fiber current transformer, as recited in claim 12, wherein said calculating compensation unit is a DSP processor chip.

20. The tri-phase optical fiber current transformer, as recited in claim 12, wherein said data processing unit is an FPGA processor chip.

* * * * *